(12) United States Patent
Schramme et al.

(10) Patent No.: US 9,360,500 B2
(45) Date of Patent: Jun. 7, 2016

(54) DEVICE FOR MEASURING A BATTERY CURRENT

(71) Applicant: Continental Automotive GmbH, Hannover (DE)

(72) Inventors: Martin Schramme, Königsbrunn (DE); Hans-Michael Graf, Regensburg (DE)

(73) Assignee: Continental Automotive GmbH (DE)

( * ) Notice: Subject to any disclaimer, the term of this patent is extended or adjusted under 35 U.S.C. 154(b) by 135 days.

(21) Appl. No.: 14/346,468

(22) PCT Filed: Sep. 20, 2012

(86) PCT No.: PCT/EP2012/068502
§ 371 (c)(1),
(2) Date: Mar. 21, 2014

(87) PCT Pub. No.: WO2013/041603
PCT Pub. Date: Mar. 28, 2013

(65) Prior Publication Data
US 2014/0300347 A1    Oct. 9, 2014

(30) Foreign Application Priority Data

Sep. 23, 2011   (DE) .................. 10 2011 083 307

(51) Int. Cl.
*G01R 15/16*    (2006.01)
*G01R 1/20*     (2006.01)
(Continued)

(52) U.S. Cl.
CPC ............ *G01R 1/203* (2013.01); *G01R 31/3606* (2013.01); *H02J 7/1453* (2013.01); *G01R 31/3675* (2013.01)

(58) Field of Classification Search
CPC .......... G01R 1/20; G01R 27/08; G01R 27/06; G01R 15/16; G01R 1/203; G01N 27/416; H02J 7/04; H02J 7/00
See application file for complete search history.

(56) References Cited

U.S. PATENT DOCUMENTS 5,444,378 A * 8/1995 Rogers ............... G01R 31/3613
                                                  320/136
5,708,351 A * 1/1998 Takamoro ............. H02J 7/0065
                                                  307/150

(Continued)

FOREIGN PATENT DOCUMENTS

CN      101398446       4/2009
DE      4221847 A1 *    1/1994

(Continued)

OTHER PUBLICATIONS

International Search Report corresponding to application No. PCT/EP2012/068502, dated Jan. 18, 2013.

(Continued)

*Primary Examiner* — Huy Q Phan
*Assistant Examiner* — Alvaro Fortich
(74) *Attorney, Agent, or Firm* — RatnerPrestia

(57) ABSTRACT

The present invention relates to a device for measuring a battery current of a battery. The device has a measuring distance, over which the entire battery current to be measured flows during the measurement. A measuring device measures a voltage drop across the measuring distance. On the basis of the measured voltage drop and a resistance of the measuring distance, a current determining device determines the battery current, wherein the measuring distance is formed by at least part of a cable with a temperature-dependent resistor.

11 Claims, 3 Drawing Sheets

(51) Int. Cl.
*H02J 7/14* (2006.01)
*G01R 31/36* (2006.01)

(56) References Cited

U.S. PATENT DOCUMENTS

| | | | |
|---|---|---|---|
| 5,982,151 A * | 11/1999 | Nagai | H02J 7/0029 |
| | | | 320/141 |
| 6,285,191 B1 | 9/2001 | Gollomp et al. | |
| 6,522,123 B2 | 2/2003 | Ribes | |
| 6,621,271 B2 * | 9/2003 | Ziegler | H01M 10/48 |
| | | | 324/425 |
| 8,173,287 B2 | 5/2012 | Sim | |
| 2003/0016022 A1 * | 1/2003 | Ziegler | H01M 10/48 |
| | | | 324/426 |
| 2004/0169489 A1 * | 9/2004 | Hobbs | B60L 3/0046 |
| | | | 320/104 |
| 2004/0212342 A1 | 10/2004 | Batson | |
| 2005/0248351 A1 * | 11/2005 | Graf | G01R 19/16542 |
| | | | 324/433 |
| 2007/0018615 A1 | 1/2007 | Graf et al. | |
| 2008/0007416 A1 * | 1/2008 | Cern | G01R 23/06 |
| | | | 340/664 |
| 2009/0078447 A1 | 3/2009 | Brantsch et al. | |
| 2009/0087725 A1 | 4/2009 | Sim | |
| 2009/0184683 A1 | 7/2009 | Abe | |
| 2010/0085015 A1 * | 4/2010 | Hamaguchi | H01M 10/0525 |
| | | | 320/134 |
| 2010/0201369 A1 * | 8/2010 | Gronwald | G01R 1/203 |
| | | | 324/430 |
| 2011/0050260 A1 * | 3/2011 | Teramoto | H01M 10/48 |
| | | | 324/705 |
| 2012/0283970 A1 | 11/2012 | Boehm | |
| 2013/0049678 A1 * | 2/2013 | Li | H02J 7/008 |
| | | | 320/107 |

FOREIGN PATENT DOCUMENTS

| | | |
|---|---|---|
| DE | 10 2004 007 851 | 9/2005 |
| DE | 10 2004 033 836 | 9/2005 |
| DE | 10 2007 045 512 | 4/2009 |
| EP | 1 452 879 | 1/2004 |
| EP | 2169412 A1 * | 3/2010 |
| JP | 2005188945 | 7/2005 |
| JP | 2005188972 | 7/2005 |
| WO | WO 98/09176 | 3/1998 |
| WO | WO 01/27641 | 4/2001 |
| WO | WO 2011/060820 | 5/2011 |

OTHER PUBLICATIONS

German Search Report corresponding to application No. DE 10 2011 083 307.2 dated Aug. 21, 2012.

Ziegler, Silvio, et al., "Investigation into Static and Dynamic Performance of the Copper Trace Current Sense Method," IEEE Sensors Journal, Jul. 1, 2009, pp. 782-792, vol. 9, No. 7, IEEE, New York, NY, USA.

Anonymous: "PS3180 SmartShunt TM Battery Monitor," Internet Citation, 2000, XP002960182, URL: http://web.archive.org/web/20010425114544/http://www.powersmart.com/products/datasheets.cfm?Datasheetid=26&sidenav=3.

* cited by examiner

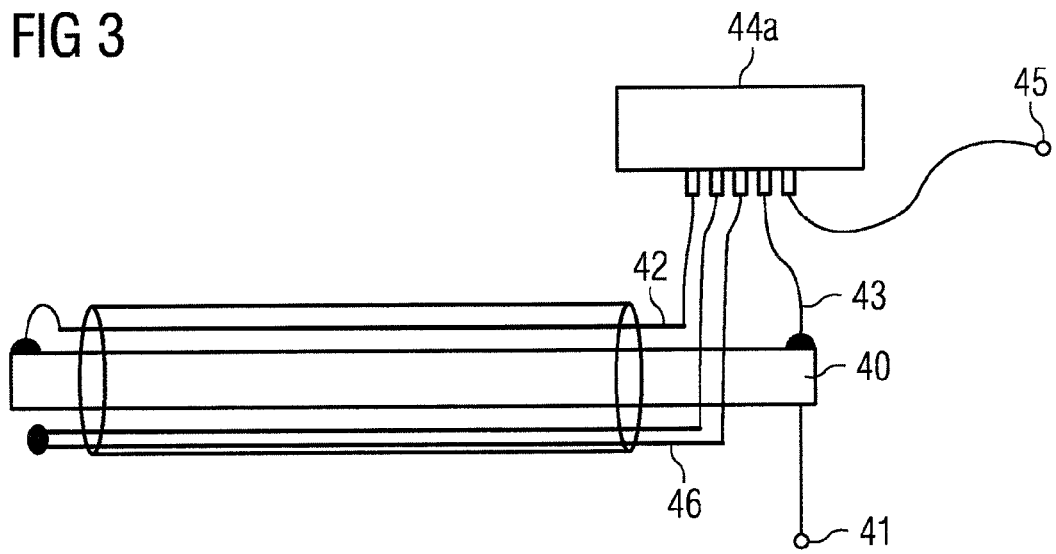
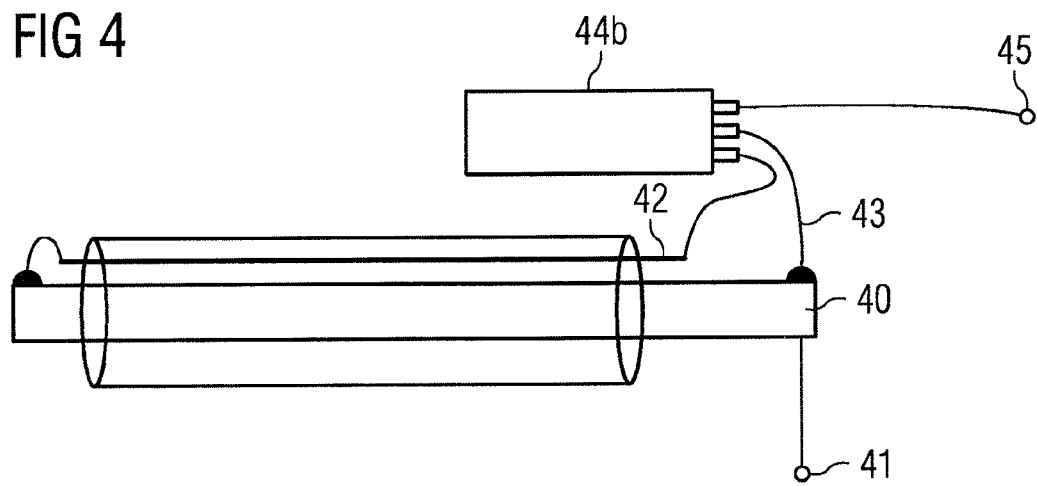

DEVICE FOR MEASURING A BATTERY CURRENT

CROSS REFERENCE TO RELATED APPLICATION

This application is the U.S. National Phase Application of PCT International Application No. PCT/EP2012/068502, filed Sep. 20, 2012, which claims priority to German Patent Application No. 10 2011 083 307.2, filed Sep. 23, 2011, the contents of such applications being incorporated by reference herein.

FIELD OF THE INVENTION

The present invention relates to a device for measuring a battery current of a battery of a vehicle.

BACKGROUND OF THE INVENTION

Such a device is known, for example, from DE 10 2007 045 512 A1, which is incorporated by reference. In said document, a pole of a car battery is connected to the body by a cable. A shunt is located between the cable and the pole of the car battery. As is described, for example, in DE 10 2004 033 836 B3, which is incorporated by reference, the voltage drop across this shunt is supplied to a measuring apparatus in order to thus determine the current which is flowing through the shunt. The advantage of the shunt consists in that its resistance is largely temperature-independent. However, this results in costs which are not inconsiderable.

SUMMARY OF THE INVENTION

An aspect of the present invention provides a cost-effective device for measuring a battery current.

In accordance with an aspect of the invention, this is achieved by a device for measuring a battery current of a battery of a vehicle comprising
  a measurement path, via which a total battery current to be measured flows during the measurement,
  a measuring apparatus for measuring a voltage drop across the measurement path, and
  a current determination apparatus for determining the battery current on the basis of the measured voltage drop and a resistance of the measurement path, wherein the measurement path is formed by at least part of a cable with a thermistor. Embodiments of the device according to the invention are specified in the dependent claims.

An aspect of the invention comprises a device for measuring a battery current of a battery of a vehicle. The device has a measurement path, via which the total battery current to be measured flows during the measurement. Within the meaning of the present patent application, a battery current is in this case understood to mean any current which increases or decreases the charge stored in the battery. For measuring a voltage drop across the measurement path, the device according to the invention has a measuring apparatus. Furthermore, the device according to the invention has a current determination apparatus for determining the battery current on the basis of the measured voltage drop and a resistance of the measurement path. In accordance with the invention, the measurement path is formed by at least part of a cable with a thermistor.

In accordance with the above-described prior art, a shunt whose resistance is largely temperature-independent is used as the measurement path. On the basis of the invention, this shunt can be dispensed with, with the result that, correspondingly, costs and manufacturing complexity can be saved.

The cable can be, for example, a grounding cable which connects a negative pole of the battery to an electrical conductor, to which the grounding points of consumers are connected. The electrical conductor can be, in particular, a body of the vehicle. The measurement path does not need to be arranged on the side of the negative pole of the battery. In an alternative embodiment, the measurement path is located at the positive pole of the battery. The cable can thus also be a connecting cable which connects a positive pole of the battery to a fuse box, for example. It is essential here that the total battery current flows via that part of the cable which acts as measurement path during the measurement.

By virtue of the use of at least part of the grounding cable or of the connecting cable arranged at the positive pole of the battery as the measurement path, it is possible to dispense with the shunt used in the prior art, as a result of which costs and, under certain circumstances, complex activities during the manufacturing process can be avoided to a considerable extent.

In one embodiment, a predetermined measurement current is multiplexed along the measurement path. The multiplexing along the measurement path can mean, for example, that the predetermined measurement current proceeds over the measurement path but is distinguishable from the battery current. Just as easily, a further cable can run parallel to the cable, with the result that a space-division multiplexing method is used.

The device according to an aspect of the invention can comprise a resistance compensation apparatus which is designed to determine a compensation voltage drop which is present along the measurement path owing to the predetermined measurement current. With the aid of the compensation voltage drop and the predetermined measurement current, the resistance of the measurement path can be compensated for.

The purpose of the resistance compensation apparatus is interrelated with the temperature dependence of the resistance of the cable. The temperature of the cable does not necessarily need to be constant over its length. In order to be able to eliminate the temperature influence in the determination of the battery current, a known measurement current can be transmitted over a path which is equivalent to the measurement path, the resistance of said equivalent path being known at a reference temperature. According to Ohm's law, given a known current and a known resistance, a voltage drop across this resistance necessarily results. If the measured voltage drop deviates from the expected voltage drop, this deviation can be ascribed to the temperature. Assuming that the measurement path is subjected to the same temperature, the temperature influence on the resistance of the measurement path can be compensated for with the aid of this deviation.

In accordance with an aspect of the invention, the multiplexing of the predetermined measurement current along the measurement path can be effected by means of various methods, that can either be used in isolation or else in combination. All of the methods which make it possible to distinguish the predetermined measurement current from the battery current can be used. Known methods are in particular the space-division multiplexing, frequency-division multiplexing, code-division multiplexing and time-division multiplexing methods.

When using the space-division multiplexing method, the device according to the invention can comprise a compensation cable which runs parallel to the cable and is thermally coupled to the cable, wherein a temperature dependence of the resistance of the cable and of the compensation cable is substantially identical. This can be achieved, for example, by virtue of the fact that the cable and the compensation cable consist of the same material.

At a reference temperature, the compensation cable can have a known resistance. Since said cable is thermally coupled to the cable, it can be assumed that the cable and the compensation cable are subjected to the same temperature influences. There are various possibilities for the physical arrangement of the cable and the compensation cable. For example, the cable can be configured as a coaxial sheath around the compensation cable. Alternatively, it is also conceivable for the compensation cable to be configured as a coaxial sheath around the cable.

By virtue of an advantageous arrangement of the compensation cable in respect of the cable, shielding with respect to electromagnetic radiation can be achieved, for example.

In one embodiment, the device according to the invention comprises a multiplexer for multiplexing the predetermined measurement current over the measurement path and a demultiplexer for isolating the measurement current from the battery current. In this way, the predetermined measurement current can be transmitted over the measurement path and at the end isolated from the battery current again.

The demultiplexer can be configured as a filter or lock-in amplifier, for example. Furthermore, a frequency generator for generating a predetermined measurement current in the form of an alternating current and/or a code generator for generating a predetermined measurement current with a modulated code can be provided. In this case, the frequency generator enables a frequency-division multiplexing method and the code generator enables a code-division multiplexing method.

In one embodiment, a time-division multiplexing method is used. In this case, the device comprises a switch which is intended to cause, in a first phase, the battery current to flow and, in a second phase, the predetermined measurement current to flow over the measurement path. In this way, the battery current can be isolated from the predetermined measurement current.

The measuring apparatus can be connected to the cable by a measurement cable and a further electrical connection. In this case, for example, the measurement cable can be wound helically around the cable in order to reduce the effects of external electromagnetic fields.

Furthermore, the cable can be configured as a coaxial sheath around the measurement cable and/or the further electrical connection. It is likewise conceivable for the measurement cable and/or the further electrical connection to act as a coaxial sheath around the cable. By skillful geometric arrangement of the current-conducting elements, the effects of external electromagnetic fields which possibly induce disruptive currents can be reduced.

Furthermore, an aspect of the invention comprises a vehicle comprising a battery and a device according to the invention for measuring a battery current of a battery.

BRIEF DESCRIPTION OF THE DRAWINGS

Further details relating to the present invention will be explained below with reference to the figures, in which:

FIG. 3 shows a schematic illustration of a second embodiment of a device according to the invention; and FIG. 4 shows a schematic illustration of a third embodiment of a device according to the invention.

DETAILED DESCRIPTION OF THE PREFERRED EMBODIMENT

In the description below, identical and functionally identical elements, insofar as not specified otherwise, are designated by the same reference symbols.

Figure 1:
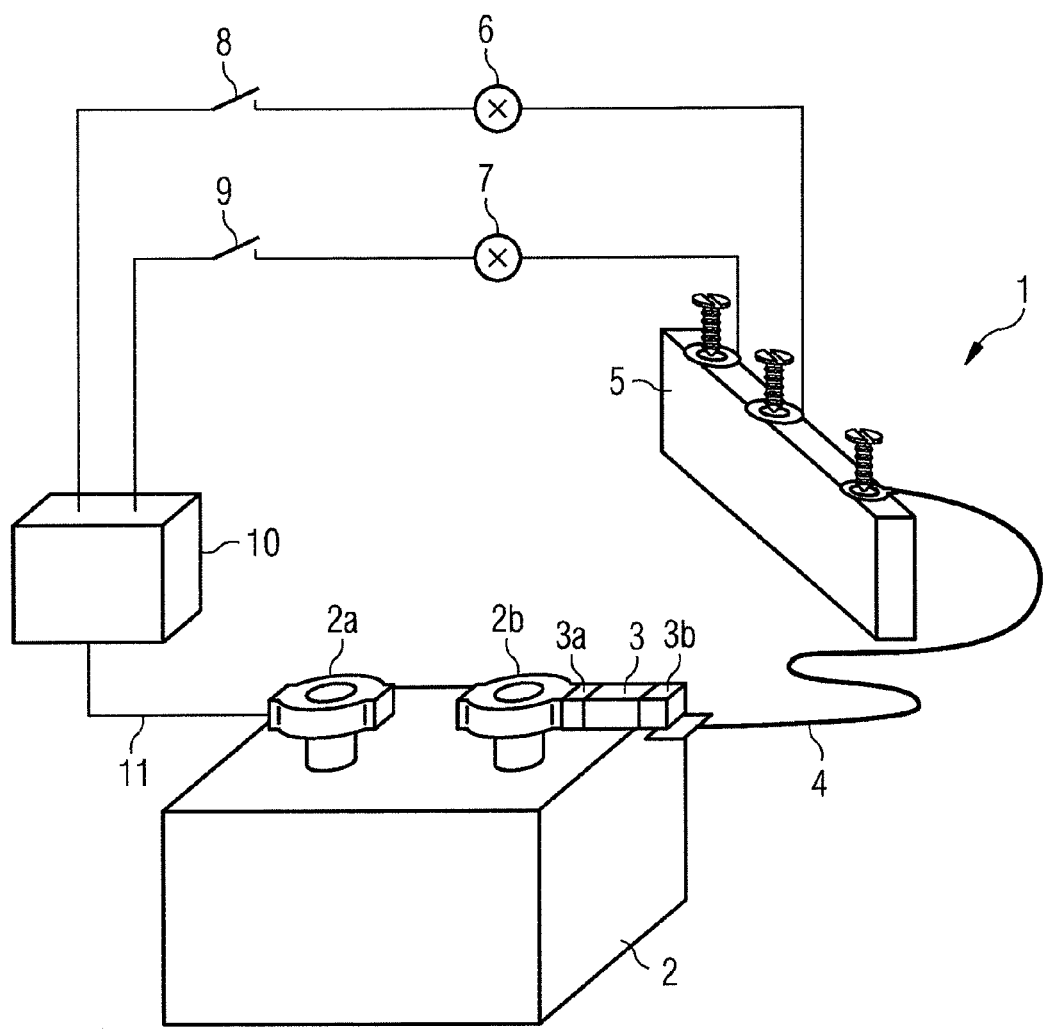
FIG. 1 shows a circuit of a vehicle comprising a battery and a device for measuring a battery current in accordance with the prior art.

FIG. 1 illustrates a circuit 1 of a vehicle comprising a battery 2 and a device for measuring a battery current in accordance with the prior art. The battery 2 has a positive pole 2a and a negative pole 2b. A shunt 3 is connected to the negative pole 2b of the battery 2 via a first connection region 3a. A grounding cable 4 is connected to the shunt 3 via a second connection region 3b.

The shunt 3 is part of an intelligent battery sensor (not illustrated in detail), which monitors the battery 2. The state and performance capability of the battery 2 are calculated from current, voltage and temperature measurements by means of a processor and software. The battery current flowing is in this case calculated with the aid of the voltage drop across the shunt 3. The voltage drop is converted into a digital signal via an amplifier and an analog-to-digital converter. Magnetic methods which detect the magnetic field caused by the current can also be used. In this case, the so-called Hall effect or magnetoresistive effect is used. In order to provide precise results, the material of the shunt 3 is optimized to the extent that the temperature of the shunt 3 has only little influence on the resistance value of said shunt.

The grounding cable 4, which is connected to the second connection region 3b of the shunt 3, is connected, at its opposite end, to the body 5 of the vehicle. Preferably, such a connection is secured by means of a screw. Two consumers 6 and 7 illustrated by way of example as lamps are connected, at their grounding points, to the body via corresponding connections. The circuits of the consumers 6 and 7 can be closed via corresponding switches 8 and 9, with the result that the lamps start to light up. On the side of the positive pole 2a of the battery 2, the circuits of the consumers 6 and 7 are protected by means of fuses, which are located in a fuse box 10. The fuse box 10 is connected to the positive pole 2a of the battery 2 via a connecting cable 11.

Figure 2:
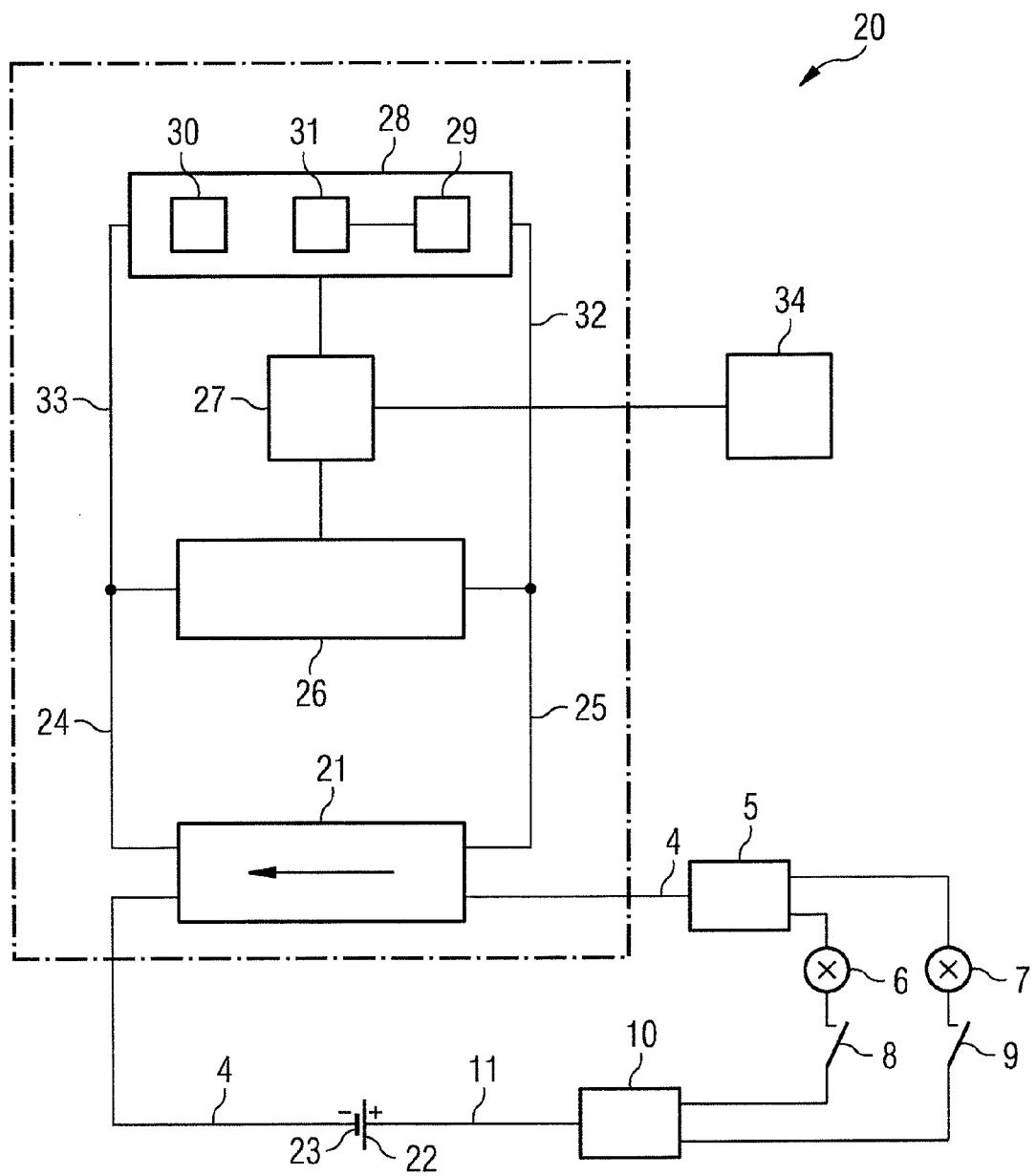
FIG. 2 shows a schematic illustration of a first embodiment of a device according to the invention.

FIG. 2 illustrates a first embodiment of a device according to the invention for measuring a battery current 20 using a schematic illustration. The measurement path 21 shown is in the form of part of the grounding cable 4. The grounding cable is connected on one side to the body 5, as has already been described with reference to FIG. 1. The grounding points of two consumers 6 and 7 are likewise connected to the body 5. The consumers 6 and 7 are connected to the fuse box 10 via two switches 8 and 9, said fuse box in turn being coupled to the positive pole 22 of the battery via a connecting cable 11. On the other side, the grounding cable 4 is connected to the negative pole 23. As soon as one of the switches 8 or 9 is closed, the battery current to be measured flows via the measurement path 21. The measurement path 21 is connected to a measuring apparatus 26, which measures a voltage drop across the measurement path 21, via a measurement cable 24 and a further electrical connection 25. The measuring apparatus 26 passes on the measured value for the voltage drop to a current determination apparatus 27, which determines the battery current on the basis of the measured voltage drop and the resistance of the measurement path 21.

The resistance value of the measurement path 21 is heavily dependent on its temperature, however. A complicating factor additionally consists in that the temperature does not necessarily need to be constant over the length of the measurement path.

In order to eliminate the influence of the temperature on the resistance of the measurement path 21, the embodiment shown of a device 20 according to the invention comprises a resistance compensation apparatus 28. Said resistance compensation apparatus has a multiplexer 29, a demultiplexer 30 and a frequency generator 31. Preferably, the frequency of the measurement current produced by the frequency generator is markedly above the frequencies of the battery current, in order that the demultiplexer 30 can distinguish the measurement current from the battery current with ease. The multiplexer 29 transmits the measurement current via the measurement path 21 over the lines 32 and 25. The circuit for the measurement current is closed via the lines 24 and 33. Owing to the voltage drop which is caused by the measurement current on the measurement path 21, the change in resistance caused by the temperature can be determined, in combination with the known resistance of the measurement path 21 at a reference temperature and the known measurement current which is flowing via the measurement path 21. The change in resistance is then used by the resistance compensation apparatus 28 for compensating for the change in resistance of the measurement path 21. The current resulting after the compensation, which current flows via the measurement path 21, is passed on to an evaluation unit 34 for further use.

FIG. 3 illustrates schematically the most important component parts of a second embodiment of a device according to the invention, in which a space-division multiplexing method is used. The grounding cable 40 is a component part of a circuit (not shown in the figure), which also contains connections of the positive pole of the battery to electrical consumers of the vehicle and the body of the vehicle. The grounding cable 40 acting as measurement path is connected at one end to a negative pole 41 of a vehicle battery. The other end of the grounding cable 40 is connected to the body of the vehicle. A voltage drop occurring across the grounding cable 40 is measured via a measurement cable 42 and a further electrical connection 43. For this, the measurement cable 42 and the further electrical connection 43 connect a printed circuit board 44a to the grounding cable 40. A measuring apparatus (not shown) and a current determination apparatus are located on the printed circuit board 44a. For the purpose of supplying current to the printed circuit board 44a, said printed circuit board is connected to the positive pole 45 of the vehicle battery. A compensation cable 46 which is coupled thermally to the grounding cable 40 runs parallel to the grounding cable 40. The temperature dependence of the resistance of the grounding cable 40 and that of the compensation cable 46 are substantially identical. This can be realized in the simplest case by virtue of the fact that the material of the grounding cable 40 and of the compensation cable 46 correspond to one another. A known measurement current is impressed on the compensation cable 46 from the printed circuit board 44a, and the voltage drop across the compensation cable 46 is determined by means of an analog-to-digital converter arranged on the printed circuit board 44a. In alternative embodiments, the grounding cable 40 or the measurement cable 42 could also be used for returning the current.

Since the material of the compensation cable 46 and its temperature are identical to the material and the temperature of the grounding cable 40, the ratio between the resistance of said cables at a reference temperature and the resistance of said cables at the present temperature is also identical. Therefore, the resistance of the grounding cable 40 is proportional to the voltage drop across the compensation cable 46. In this way, the temperature drift of the resistance of the grounding cable 40 can be eliminated.

Particularly advantageously, in the exemplary embodiment in FIG. 3, the compensation cable 46 runs forward and back to the printed circuit board 44a along the entire grounding cable 40. Thus, a length of the compensation cable 46 which is as long as possible is achieved and therefore a resistance which is as large as possible and is proportional to the cable length is achieved. This reduces the requirements that have to be met in terms of the precision of the voltage measurement which is implemented so as to determine the temperature-dependent change in resistance of the compensation cable 46. At the same time, the compensation cable 46 forms a closed circuit outside the printed circuit board 44a without any additional connecting elements that could influence the determination of the change in resistance of the compensation cable 46. A further advantage of this embodiment consists in that the known measurement current impressed on the compensation cable 46 can be, for example, a direct current which can be made available using particularly simple means or means which are in any case provided on the printed circuit board 44a.

The further electrical connection 43 can be configured, for example, as a cable or else as an electrically conductive holder for the printed circuit board 44a at the connection terminal of the cable. The measurement cable 42 and the further electrical connection 43 can also be laid separately from the grounding cable 40.

In general, instead of cables, various other forms of electrical conductors can also be used. The term cable in accordance with the present patent application is not restricted to a round cross section. Any current-conducting shape is generally usable. For example, rectangular cross sections can also be used. Furthermore, the grounding cable 40, the measurement cable 42, the further electrical connection 43 and the compensation cable 46 can be configured as individual litz wires of a cable, wherein the litz wires are electrically insulated from one another. Nevertheless, thermal coupling between the grounding cable 40 and the compensation cable 46 naturally needs to still be ensured. Similarly, coaxial cables can be used, in which one or more of the current-conducting elements 40, 42, 43 and 46 act as a coaxial sheath around one or more current-conducting elements 40, 42, 43, 46.

Typically, commercially available grounding cables have a length of approximately 50 cm and a resistance of approximately 100 μohms. Therefore, the voltage drop across the grounding cable in the case of quiescent currents of approximately 20 mA is only a few μV. With these orders of magnitude, currents which are induced by an external electromagnetic field can definitely play a role. Therefore, it may be advantageous to wind the measurement cable 42 helically around the grounding cable 40.

FIG. 4 shows a schematic illustration of a third embodiment of a device according to the invention for measuring a battery current. In turn, the poles of the battery are provided with the reference symbols 41 and 45. The printed circuit board 44b comprises, inter alia, a measuring apparatus, a current determination apparatus, a frequency generator and a demultiplexer in the form of a filter. The voltage drop across the grounding cable 40 is measured by the measurement cable 42 and the further electrical connection 43. In contrast to the embodiment shown in FIG. 3, however, no compensation cable 46 is used. Instead, the printed circuit board 44b delivers a radiofrequency measurement current with the aid of the frequency generator, which measurement current is likewise conducted via the grounding cable 40. Since the frequency of said current considerably differs from the frequencies of the battery current, the voltage drop caused by the measurement current can be determined by means of the filter. On the basis of the known measurement current, the resistance of the grounding cable 40 can be determined and compensated for.

Instead of the printed circuit boards 44a, 44b, it is also possible to use a semiconductor chip, a thin-layer hybrid, a leadframe or another type of electrical circuit.

The explanations given in respect of the figures should be understood as being purely illustrative and not restrictive. Considerable amendments can be made to the embodiments without departing from the scope of protection as set forth in the attached claims. Furthermore, the features of the described embodiments can be combined with one another in order to provide further embodiments which are optimized for the respective application purpose.

LIST OF REFERENCE SYMBOLS

1 Circuit of a vehicle
2 Battery
2a Positive pole
2b Negative pole
3 Shunt
3a First connection region of shunt
3b Second connection region of shunt
4 Grounding cable
5 Body
6, 7 Consumers
8, 9 Switches
10 Fuse box
11 Connecting cable
20 First embodiment of a device according to the invention
21 Measurement path
22 Positive pole of battery
23 Negative pole of battery
24 Measurement cable
25 Further electrical connection
26 Measuring apparatus
27 Current determination apparatus
28 Resistance compensation apparatus
29 Multiplexer
30 Demultiplexer
31 Frequency generator
32 Line
33 Line
40 Grounding cable
41 Negative pole of battery
42 Measurement cable
43 Further electrical connection
44a Printed circuit board
44b Printed circuit board
45 Positive pole of battery
46 Compensation cable

The invention claimed is:

1. A device for measuring a battery current of a battery of a vehicle, comprising
   a measurement path, including a thermistor via which a total battery current to be measured flows during the measurement,
   a measuring apparatus for measuring a voltage drop across the thermistor, and
   a current determination apparatus for determining the battery current on the basis of the measured voltage drop; and
   a resistance compensation apparatus:
      generating and applying a measurement current to the thermistor,
      determining a change in resistance of the thermistor in response to the measurement current,
      determining a compensation current based on the change in resistance, and
      applying the compensation current to the thermistor.

2. The device as claimed in claim 1, wherein measurement path includes either a grounding cable, which connects a negative pole of the battery to an electrical conductor, to a body of the vehicle, to which conductor the grounding point of consumers are connected, or a connecting cable, which is arranged at a positive pole of the battery.

3. The device as claimed in claim 1, wherein the device is designed to multiplex a predetermined measurement current along the measurement path.

4. The device as claimed in claim 3, wherein the device is designed to implement the multiplexing by at least one method from the group consisting of space-division multiplexing methods, frequency-division multiplexing methods, code-division multiplexing methods and time-division multiplexing methods.

5. The device as claimed in claim 1, wherein a compensation cable runs parallel to a cable of the measurement path and is thermally coupled to the cable, wherein a temperature dependence of the resistance of the cable and of the compensation cable is substantially identical.

6. The device as claimed in claim 1, further comprising a multiplexer for multi-plexing the predetermined measurement current over the measurement path and a demultiplexer for isolating the measurement current from the battery current.

7. The device as claimed in claim 6, wherein the demultiplexer is configured as a filter or a lock-in amplifier.

8. The device as claimed in claim 6, further comprising a frequency generator for generating a predetermined measurement current in the form of an alternating current and/or a code generator for generating a predetermined measurement current with a modulated code.

9. The device as claimed in claim 1, further comprising a switch for ensuring that, in a first phase, only the battery current and, in a second phase, additionally a predetermined measurement current flows via the measurement path.

10. The device as claimed in claim 1, wherein the measuring apparatus is connected to a cable of the measurement path by a measurement cable and a further electrical connection.

11. A vehicle comprising a battery and a device for measuring a battery current of a battery of a vehicle, comprising
   a measurement path, including a thermistor via which a total battery current to be measured flows during the measurement,
   a measuring apparatus for measuring a voltage drop across the thermistor, and
   a current determination apparatus for determining the battery current on the basis of the measured voltage drop; and
   a resistance compensation apparatus:
      generating and applying a measurement current to the thermistor,
      determining a change in resistance of the thermistor in response to the measurement current,
      determining a compensation current based on the change in resistance, and
      applying the compensation current to the thermistor.

* * * * *